United States Patent
Song

(10) Patent No.: US 9,735,327 B2
(45) Date of Patent: Aug. 15, 2017

(54) LIGHT EMITTING DEVICE AND MANUFACTURING METHOD FOR SAME

(71) Applicant: LG INNOTEK CO., LTD., Seoul (KR)

(72) Inventor: June O Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 130 days.

(21) Appl. No.: 14/312,495

(22) Filed: Jun. 23, 2014

(65) Prior Publication Data

US 2014/0306254 A1 Oct. 16, 2014

Related U.S. Application Data

(63) Continuation of application No. 12/936,071, filed as application No. PCT/KR2009/001679 on Apr. 1, 2009, now Pat. No. 8,791,481.

(30) Foreign Application Priority Data

Apr. 1, 2008 (KR) .................. 10-2008-0030106

(51) Int. Cl.
*H01L 33/00* (2010.01)
*H01L 33/60* (2010.01)
*H01L 33/08* (2010.01)
*H01L 33/38* (2010.01)
*H01L 33/62* (2010.01)
(Continued)

(52) U.S. Cl.
CPC .......... *H01L 33/60* (2013.01); *H01L 33/0079* (2013.01); *H01L 33/08* (2013.01); *H01L 33/387* (2013.01); *H01L 33/62* (2013.01); *H01L 33/0095* (2013.01); *H01L 33/145* (2013.01);
(Continued)

(58) Field of Classification Search
CPC ....................................................... H01L 33/60
See application file for complete search history.

(56) References Cited

U.S. PATENT DOCUMENTS 6,504,180 B1 *  1/2003  Heremans et al. ............. 257/98
7,335,924 B2    2/2008  Liu et al. ........................ 257/98
(Continued)

FOREIGN PATENT DOCUMENTS

JP     11-251685     9/1999
JP     2003-162231   6/2003
(Continued)

OTHER PUBLICATIONS

European Search Report issued in related Application No. 09754930.7 dated Jan. 7, 2014.
(Continued)

*Primary Examiner* — Jerome Jackson, Jr.
(74) *Attorney, Agent, or Firm* — KED & Associates, LLP

(57) ABSTRACT

Disclosed are a light emitting device and a method of manufacturing the same. The light emitting device includes a support substrate, a reflective ohmic contact layer on the support substrate, a functional complex layer including a process assisting region and ohmic contact regions divided by the process assisting region on the reflective ohmic contact layer, and a light emitting semiconductor layer including a second conductive semiconductor layer, an active layer, and a first conductive semiconductor layer on each ohmic contact region.

13 Claims, 14 Drawing Sheets

(51) Int. Cl.
    *H01L 33/14*    (2010.01)
    *H01L 33/44*    (2010.01)
(52) U.S. Cl.
    CPC ...... *H01L 33/44* (2013.01); *H01L 2924/0002* (2013.01)

(56) References Cited

U.S. PATENT DOCUMENTS

| 7,732,301 | B1 | 6/2010 | Pinnington et al. | 438/455 |
| 7,906,788 | B2* | 3/2011 | Nagai | 257/88 |
| 2003/0141506 | A1 | 7/2003 | Sano et al. | 257/78 |
| 2005/0205875 | A1 | 9/2005 | Shei et al. | 257/79 |
| 2007/0290215 | A1 | 12/2007 | Kato et al. | 257/79 |
| 2008/0135868 | A1* | 6/2008 | Okagawa et al. | 257/99 |
| 2010/0034230 | A1* | 2/2010 | Tamura et al. | 372/45.011 |

FOREIGN PATENT DOCUMENTS

| JP | 2004-281863 | 10/2004 |
| JP | 2008 041839 | 2/2008 |
| KR | 10-0631981 | 10/2006 |
| KR | 10-2007-0058713 | 6/2007 |
| WO | WO 2006/038665 | 4/2006 |
| WO | WO2006/068297 | * 6/2006 |
| WO | WO 2006/116030 | 11/2006 |

OTHER PUBLICATIONS

International Search Report issued in related Application No. PCT/KR2009/001679 dated Dec. 3, 2009.

Korean Office Action issued in related Application No. 10-2008-0030106 dated Mar. 12, 2014.

U.S. Office Action issued in co-pending U.S. Appl. No. 12/936,071 dated Mar. 22, 2013.

U.S. Office Action issued in co-pending U.S. Appl. No. 12/936,071 dated Nov. 7, 2013.

U.S. Notice of Allowance issued in co-pending U.S. Appl. No. 12/936,071 dated Mar. 14, 2014.

* cited by examiner

【FIG. 1】
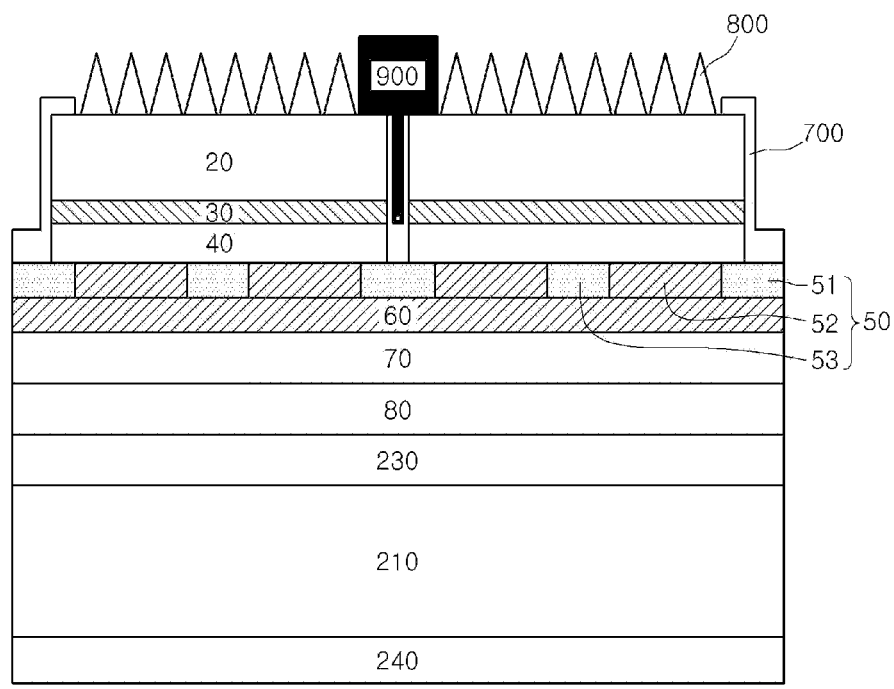
【FIG. 2】
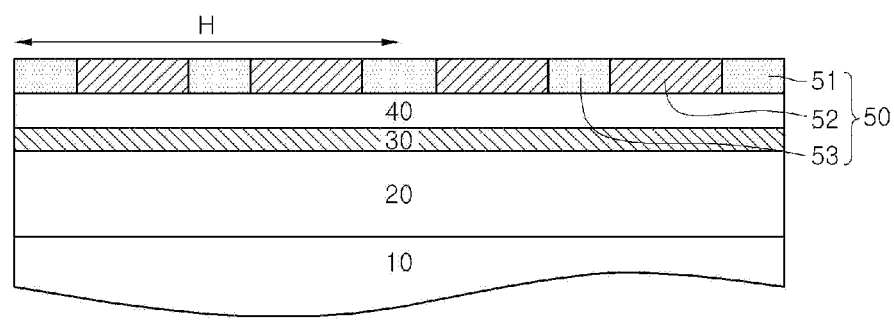

[FIG. 3]
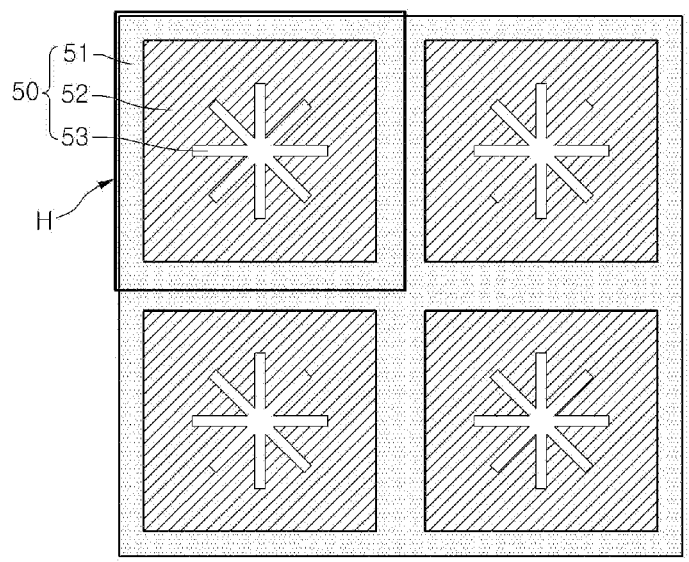
[FIG. 4]
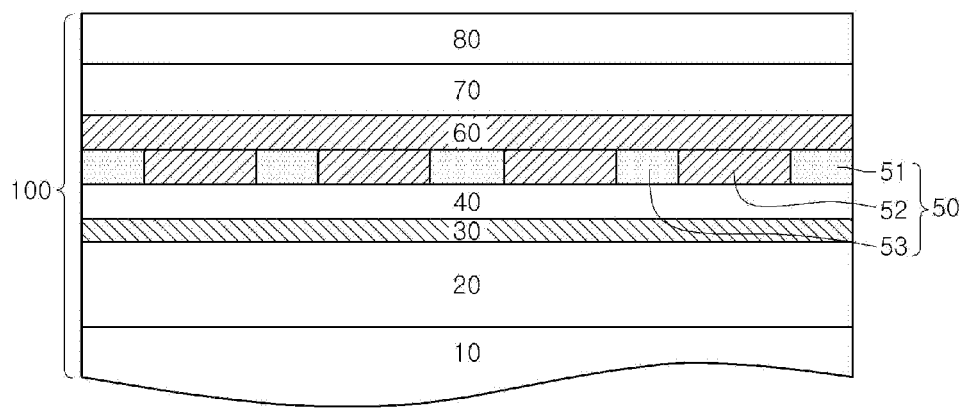
[FIG. 5]
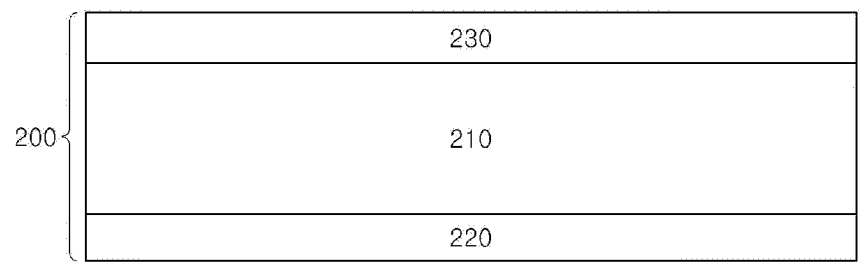

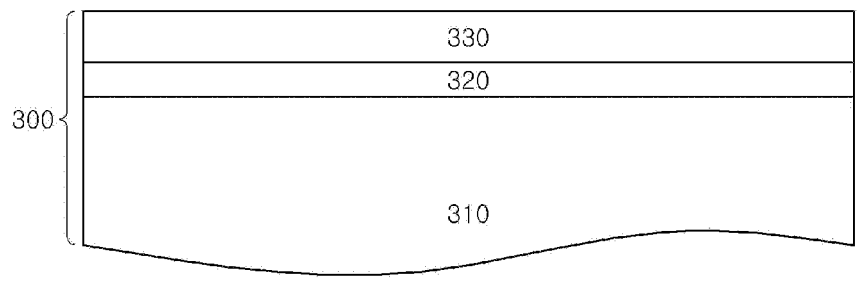
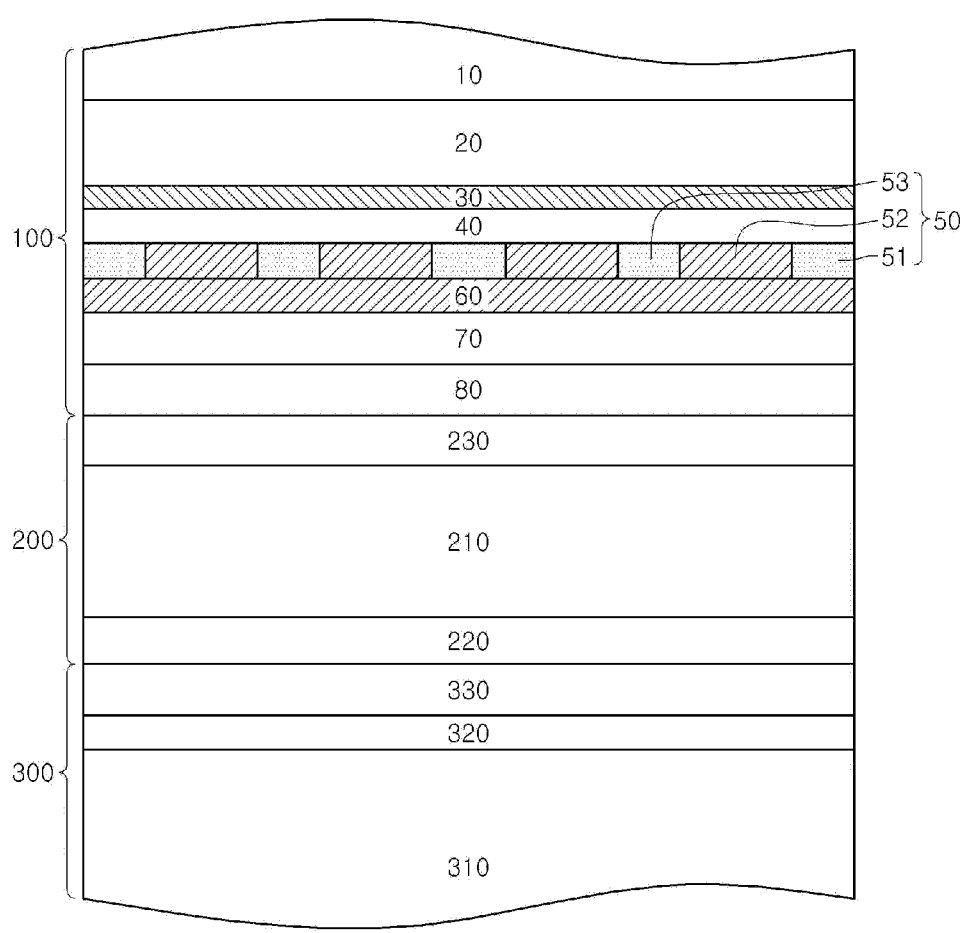

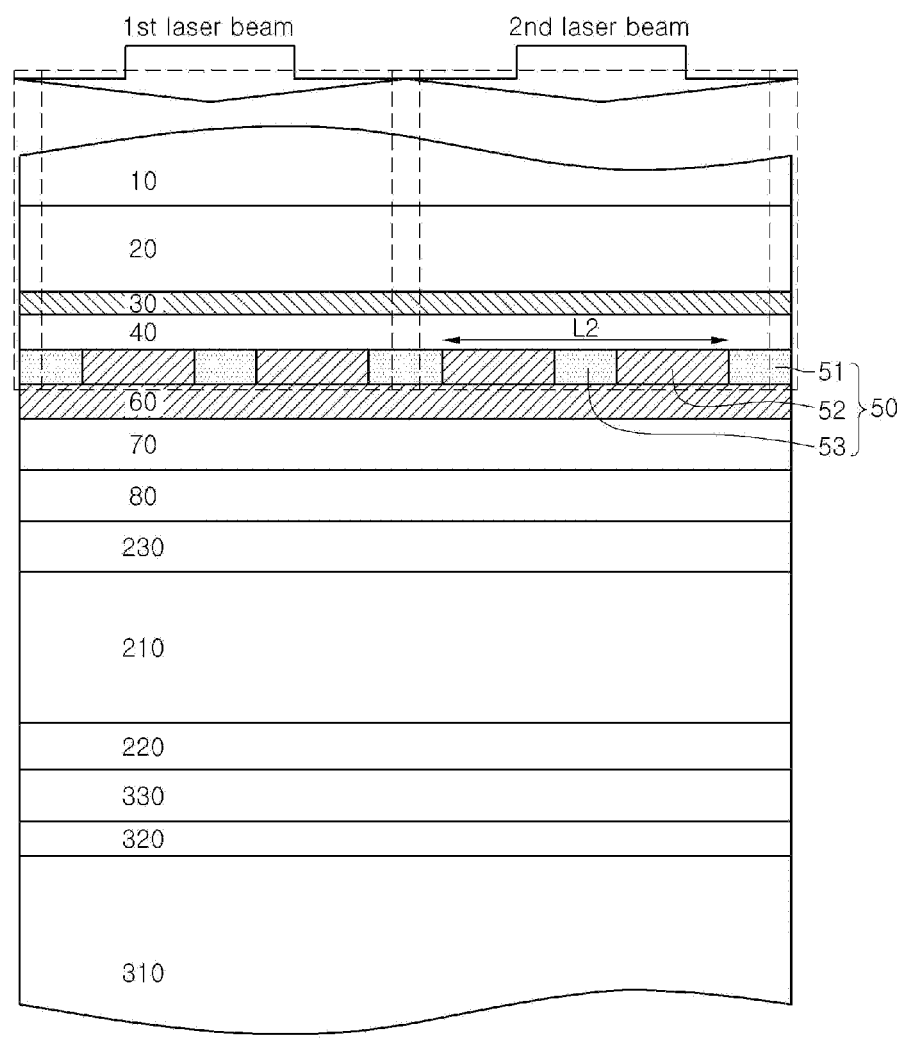

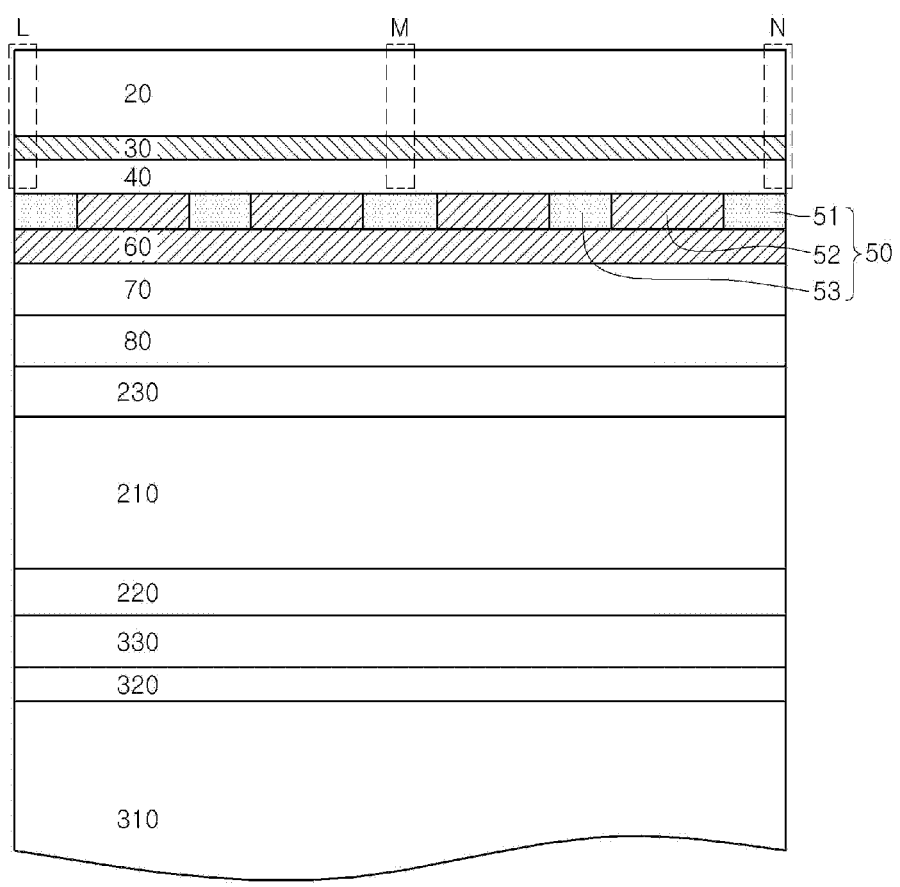

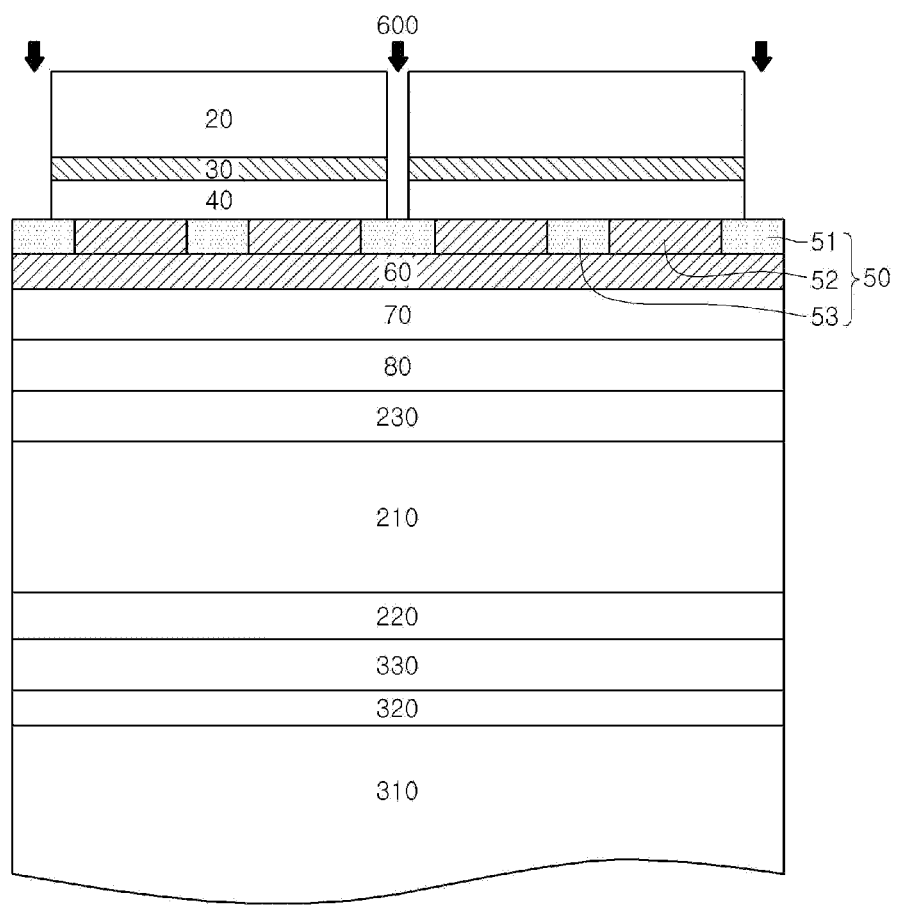

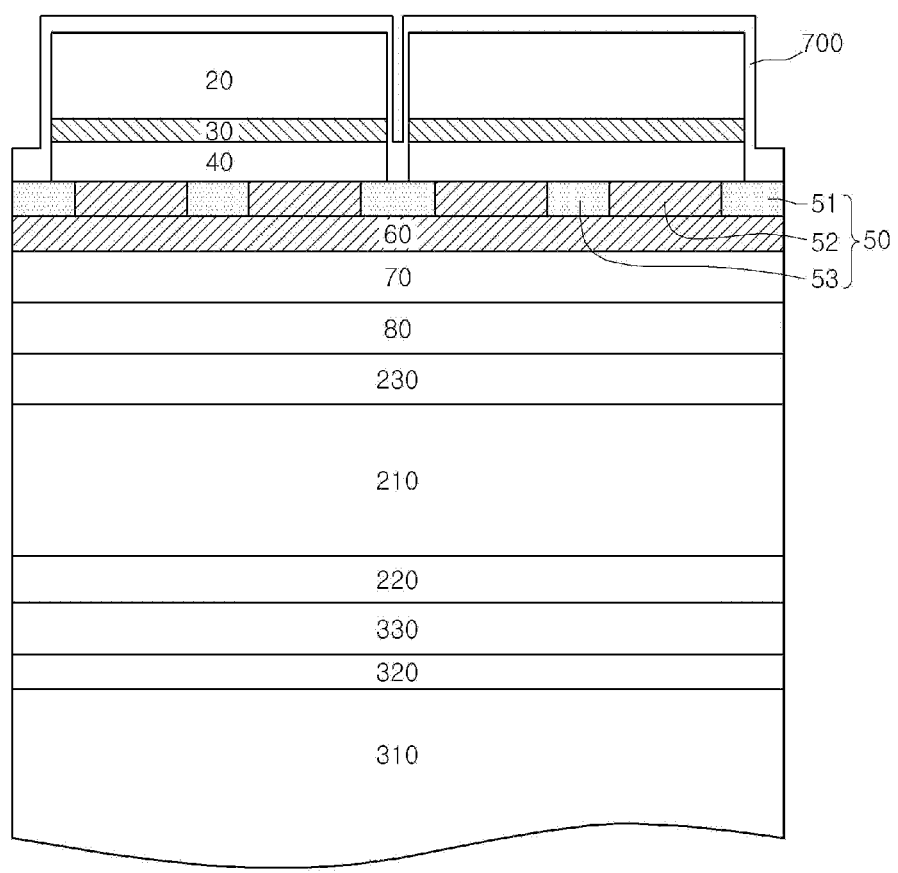
[FIG. 11]

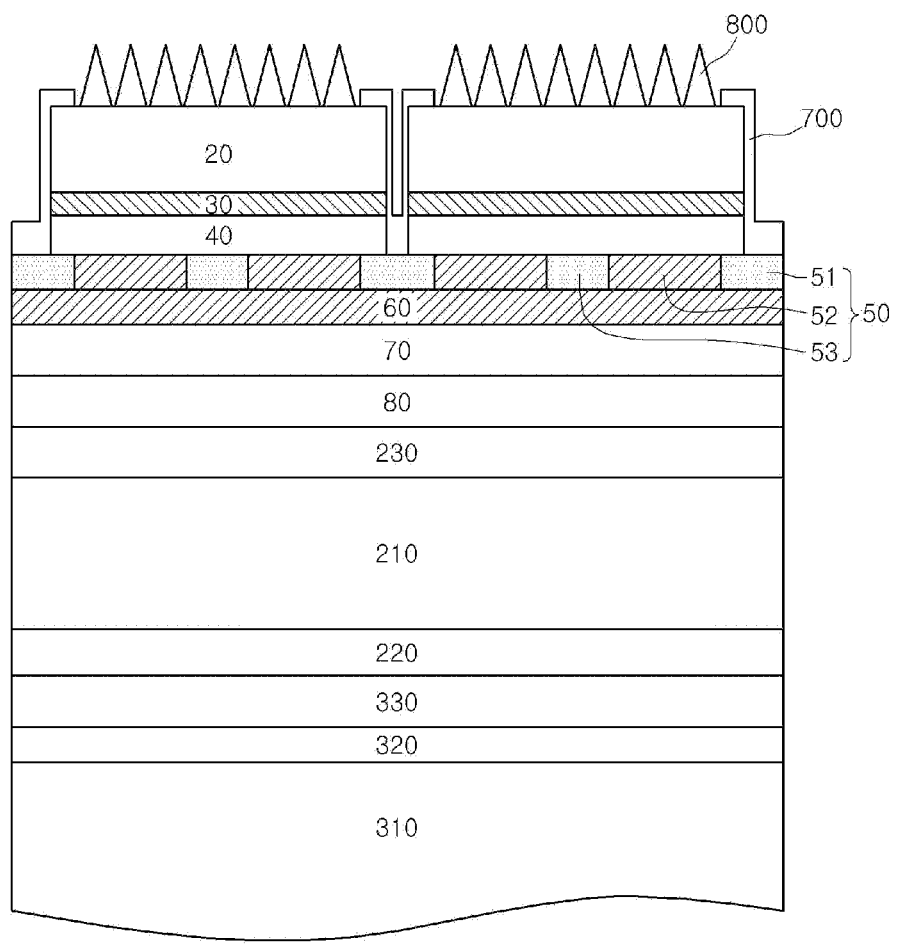
[FIG. 12]

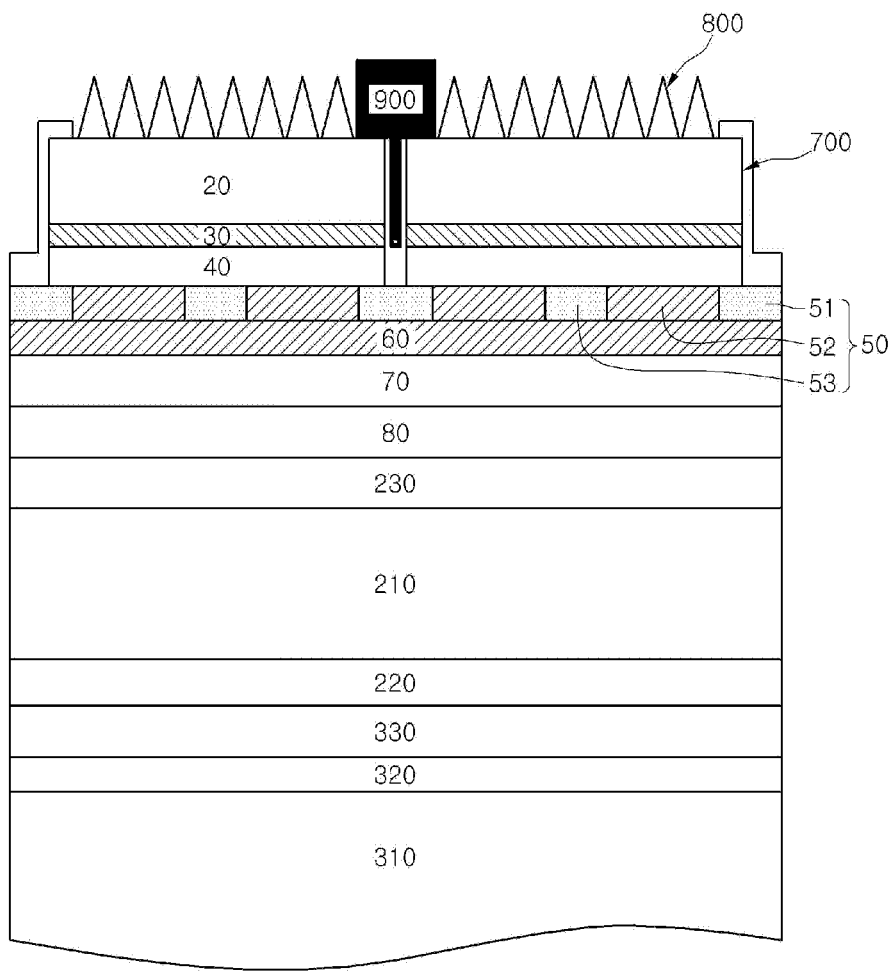
[FIG. 13]

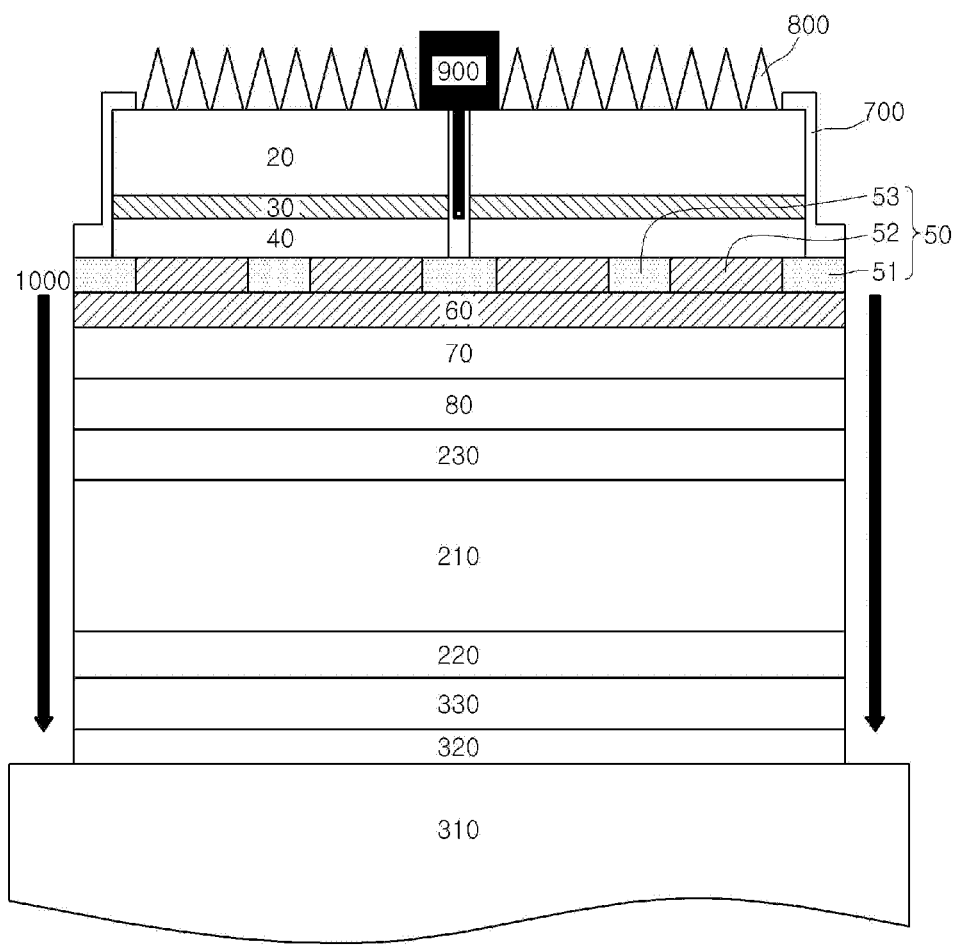
[FIG. 14]

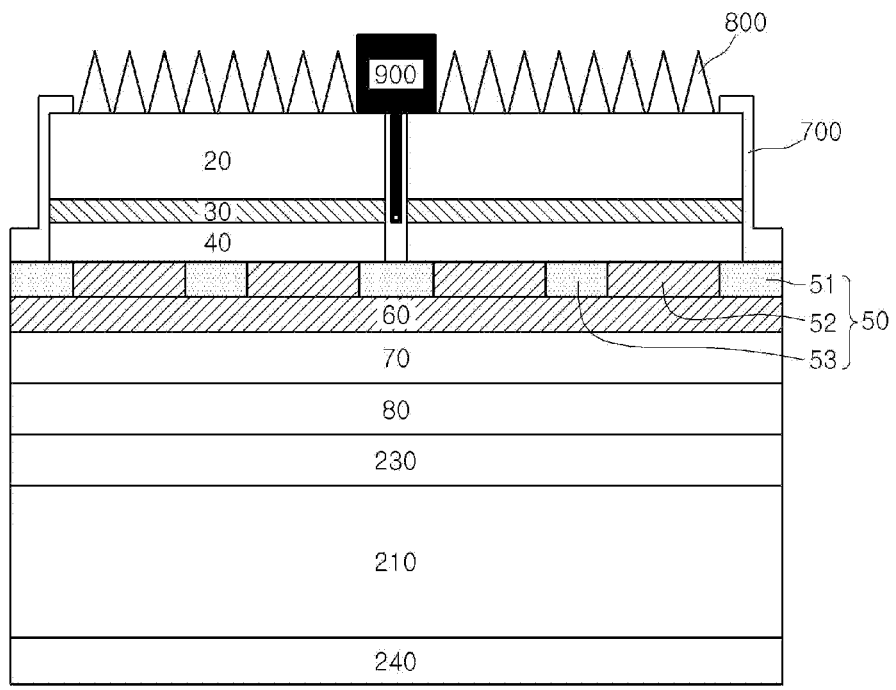
[FIG. 15]
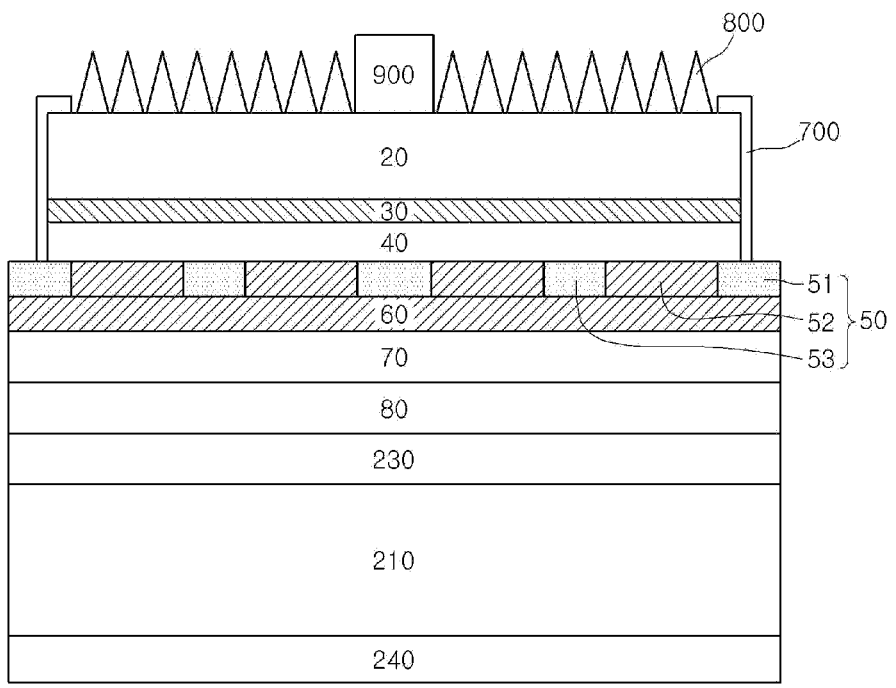
[FIG. 16]

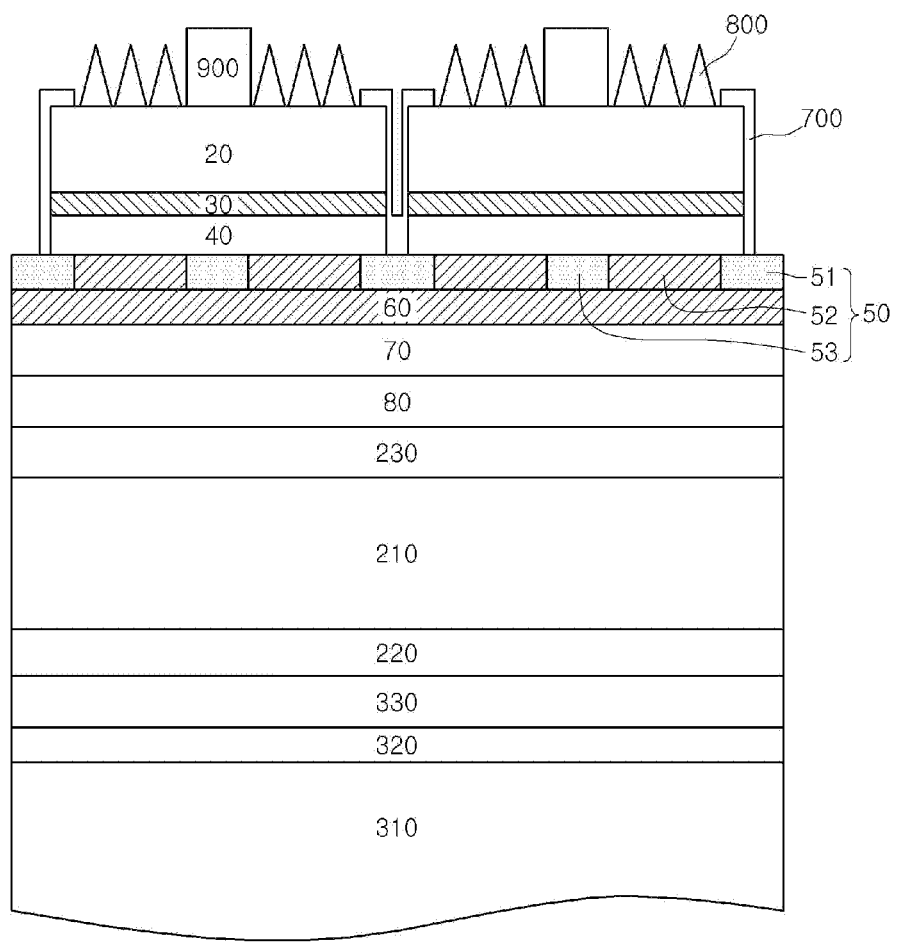
[FIG. 17]

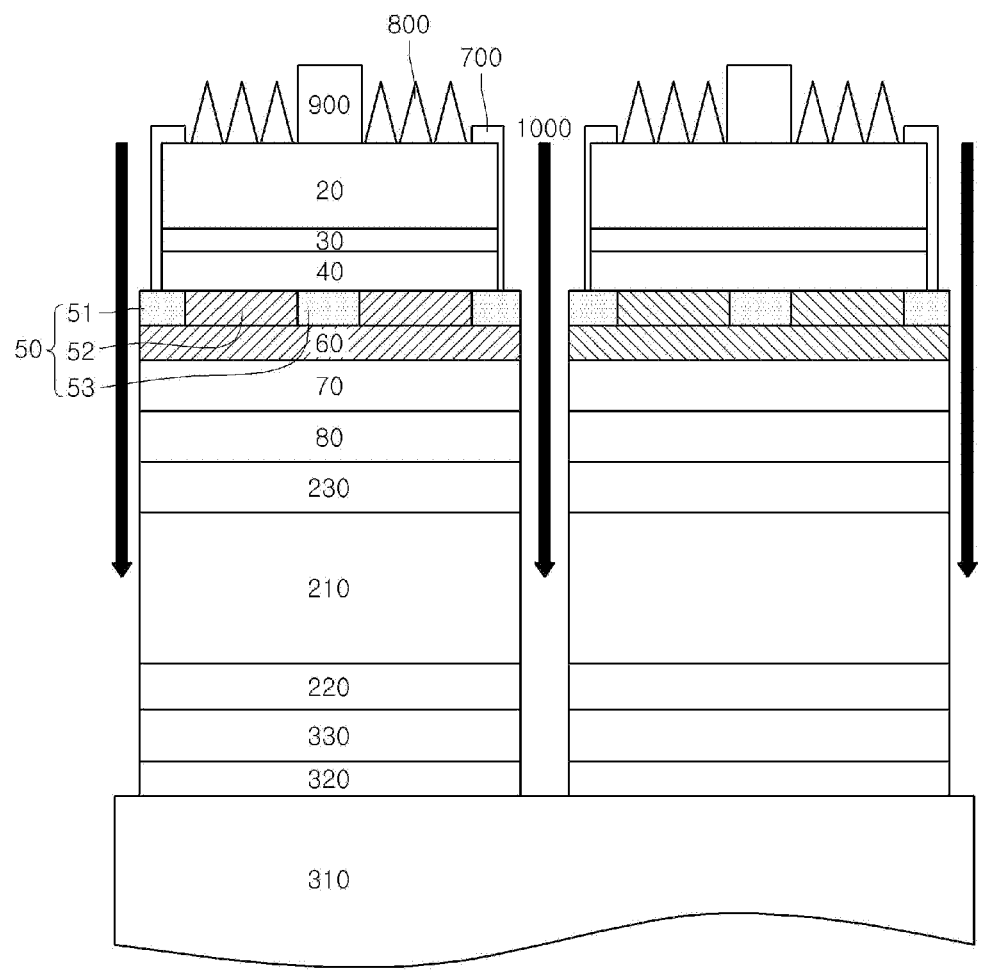
[FIG. 18]

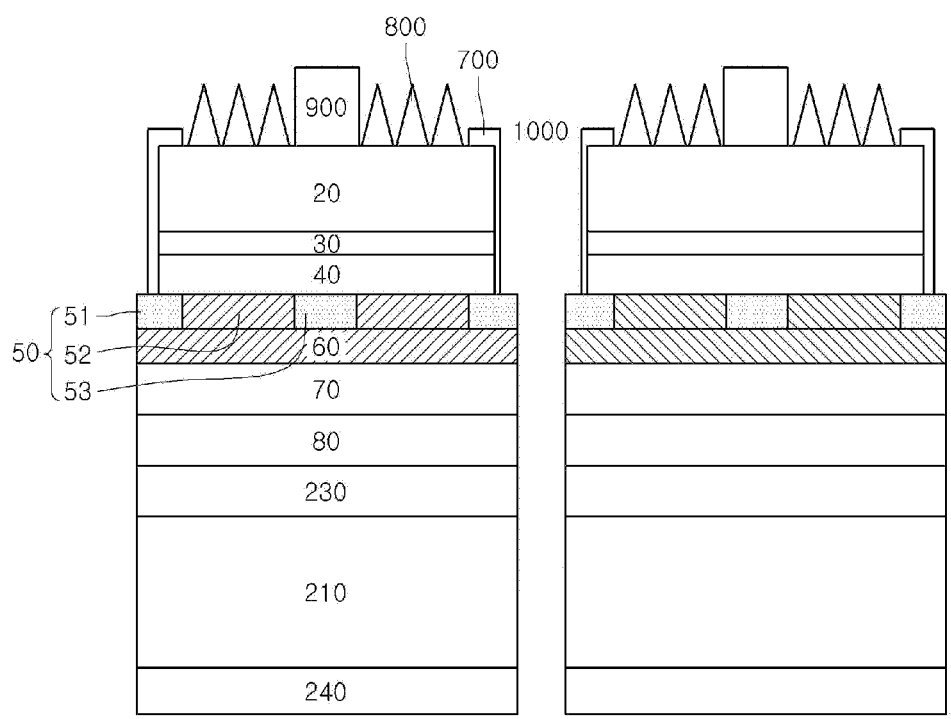
[FIG. 19]

LIGHT EMITTING DEVICE AND MANUFACTURING METHOD FOR SAME

CROSS-REFERENCE TO RELATED APPLICATIONS

This application is a Continuation of co-pending U.S. patent application Ser. No. 12/936,071 filed on Feb. 22, 2011, which is a U.S. National Stage Application under 35 U.S.C. §371 of PCT Application No. PCT/KR2009/001679 filed on Apr. 1, 2009, which claims priority to Korean Patent Application No. 10-2008-0030106 filed on Apr. 1, 2008, whose entire disclosures are hereby incorporated by reference.

TECHNICAL FIELD

The present invention relates to a light emitting device and a method of manufacturing the same.

BACKGROUND ART

Recently, a light emitting diode (LED) is spotlighted as a light emitting device. Since the LED can convert electric energy into light energy with high efficiency and long life span of about 5 years or more, the LED can remarkably reduce the energy consumption and repair and maintenance cost. In this regard, the LED is spotlighted in the next-generation lighting field.

Such an LED includes a first conductive semiconductor layer, an active layer and a second conductive semiconductor layer, in which the active layer generates light according to current applied thereto through the first and second conductive semiconductor layers.

The LED may be classified into a lateral type LED and a vertical type LED.

According to the lateral type LED, a first conductive semiconductor layer, an active layer and a second conductive semiconductor layer are formed on a growth substrate, and the second conductive semiconductor layer, the active layer and the first conductive semiconductor layer are partially removed such that a part of the first conductive semiconductor layer can be exposed to form an electrode layer. Thus, the light emitting area may be reduced so that the light efficiency may be degraded.

In addition, according to the lateral type LED, since the first conductive semiconductor layer, the active layer and the second conductive semiconductor layer are formed on the growth substrate having low thermal conductivity, the heat dissipation is not easy.

In contrast, according to the vertical type LED, a first electrode layer is formed on the first conductive semiconductor layer and a second electrode layer is formed under the second conductive semiconductor layer, so it is not necessary to remove the active layer to form the electrode layer. Thus, the light emitting area may not be reduced, so that the light efficiency may be improved as compared with that of the lateral type LED.

In addition, according to the vertical type LED, heat is transferred through the second electrode layer, so the heat dissipation is easy.

Meanwhile, the vertical type LED may employ the electroplating scheme and the wafer bonding scheme when the second electrode serving as a support substrate is formed under the second conductive semiconductor layer.

If the support substrate is manufactured through the electroplating scheme, the manufacturing process may be facilitated, but the reliability for the LED may be degraded. In addition, if the support substrate is manufactured through the wafer bonding scheme, the manufacturing process may be complicated, but the reliability for the LED may be improved. In particular, if the support substrate is manufactured through the wafer bonding scheme, since the growth substrate and the support substrate are made from heterogeneous materials, the crack or debonding may occur in the LED after the wafer has been bonded due to thermal stress caused by difference in thermal expansion coefficient.

In the vertical type LED, a first electrode layer is formed on the first conductive semiconductor layer by separating a growth substrate. However, when the growth substrate is separated by using a laser beam, an LED having a light emission area exceeding the area of the laser beam can not be manufactured.

DISCLOSURE

Technical Problem

The embodiment provides a light emitting device having a novel structure and a method of manufacturing the same.

The embodiment provides a method of manufacturing a light emitting device by using a novel wafer bonding scheme.

The embodiment provides a light emitting device having a large light emission area and a method of manufacturing the same.

Technical Solution

According to the embodiment, the light emitting device includes a support substrate, a reflective ohmic contact layer on the support substrate, a functional complex layer including a process assisting region and ohmic contact regions divided by the process assisting region on the reflective ohmic contact layer, and a light emitting semiconductor layer including a second conductive semiconductor layer, an active layer, and a first conductive semiconductor layer on each ohmic contact region.

According to the embodiment, the light emitting device includes a support substrate, a reflective ohmic contact layer on the support substrate, a functional complex layer including a process assisting region and ohmic contact regions surrounded by the process assisting region on an outer peripheral surface of the reflective ohmic contact layer, and a light emitting semiconductor layer including a second conductive semiconductor layer, an active layer, and a first conductive semiconductor layer on the ohmic contact regions.

According to the embodiment, a method of manufacturing a light emitting device includes preparing a first structure including a first conductive semiconductor layer on a growth substrate, an active layer on the first conductive semiconductor layer, a second conductive semiconductor layer on the active layer, a functional complex layer including a process assisting region and ohmic contact regions divided by the process assisting region on the second conductive semiconductor layer, and a reflective ohmic contact layer on the function complex layer, preparing a second structure on a support substrate, preparing a third structure on a temporary substrate, forming a complex structure by bonding the first to third structures through a wafer bonding layer while interposing the second structure between the first and third structures, separating the growth substrate from the complex structure, forming a light emitting semiconductor layer having a plurality of unit structures by selectively etching the first conductive semiconductor layer, the active layer, and the second conductive semiconductor layer such that the process assisting region is exposed, forming a first electrode layer on the first conductive semiconductor layer, and removing the temporary substrate.

Advantageous Effects

The embodiment can provide a light emitting device having a novel structure and a method of manufacturing the same.

The embodiment can provide a method of manufacturing a light emitting device by using a novel wafer bonding scheme.

The embodiment can provide a light emitting device having a large light emission area and a method of manufacturing the same.

DESCRIPTION OF DRAWINGS

FIG. 1 is a sectional view showing the structure of a light emitting device according to a first embodiment;

FIGS. 2 to 15 are sectional views showing a method of manufacturing the light emitting device according to the first embodiment;

FIG. 16 is a view showing the structure of a light emitting device according to a second embodiment; and FIGS. 17 to 19 are the method of manufacturing the light emitting device according to the second embodiment.

MODE FOR INVENTION

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIG. 1 is a view showing the structure of a light emitting device according to a first embodiment.

Referring to FIG. 1, the light emitting device according to the first embodiment includes a support substrate 210, a diffusion barrier layer 70 on the support substrate 210, a reflective ohmic contact layer 60 on the diffusion barrier layer 70, a functional complex layer 50 on the reflective ohmic contact layer 60, a light emitting semiconductor layer including a second conductive semiconductor layer 40, an active layer 30, and a first conductive semiconductor layer 20 on the functional complex layer 50, and a first electrode layer 900 on the light emitting semiconductor layer.

In addition, a die-bonding layer 240 may be formed under the support substrate 210, and may be firmly bonded to a printed circuit board, in which the light emitting device is installed, or a die with low resistance.

The support substrate 210 includes an electric conductive layer. The support substrate 210 may include a wafer substrate including at least one selected from the group consisting of Si, SiGe, ZnO, GaN, AlSiC, and GaAs. The support substrate 210 may include metal including at least one selected from the group consisting of Cu, Ni, Ag, Al, Nb, Ta, Ti, Au, Pd, W, and the alloy thereof, or a solid solution.

The support substrate 210 has the form of a sheet, a disk, or a foil at a thickness in the range of 10 µm to 1 mm. The support substrate 210 may be formed through an electroplating scheme, a PVD (Physical Vapor Deposition) scheme or a CVD (Chemical Vapor Deposition) scheme.

In addition, first and second wafer bonding layers 80 and 230 may be interposed between the support substrate 210 and the reflective ohmic contact layer 60. The first and second wafer bonding layers 80 and 230 allow the support substrate 210 to be firmly bonded to the reflective ohmic contact layer 60.

The first and second wafer bonding layers 80 and 230 include an electric conductive layer having strong bonding strength at predetermined pressure and temperature. For example, the first and second wafer bonding layers 80 and 230 may include at least one selected from the group consisting of Au, Ag, Al, Si, Ge, W, Mo, V, Sc, Hf, Ir, Re, Co, Zr, Ru, Ta, Nb, Mn, Rh, Cu, Ni, Ti, Pd, Pt, Cr, and rare-earth metal.

In addition, a passivation layer 700 may be formed at a lateral side of the light emitting semiconductor layer, and a light extracting structure 800 may be formed on the light emitting semiconductor layer.

The diffusion barrier layer 70 prevents a material constituting the first and second wafer bonding layers 80 and 230 from being diffused into the reflective ohmic contact layer 60 when the first and second wafer bonding layers 80 and 230 are bonded to each other at a temperature in the range of about 300° C. to about 600° C.

The functional complex layer 50 includes a process assisting region 51, an ohmic contact region 52, and a current blocking region 53.

The ohmic contact region 52 is divided into a plurality of regions by the process assisting region 51, and the current blocking region 53 is provided in the ohmic contact region 52.

The process assisting region 51 may have the form of a lattice cell. Light emitting semiconductor layers including the second conductive semiconductor layer 40, the active layer 30, and the first conductive semiconductor layer 20 are in regions divided by the process assisting region 51.

The process assisting region 51 may include an electric insulating material or a material forming a schottky contact interface with respect to the second conductive semiconductor layer 40. For example, the process assisting region 51 may include one selected from the group consisting of $Al_2O_3$, SiN, $TiO_2$, $ZrO_2$, $Si_3N_4$, and $SiO_2$.

The process assisting region 51 prevents the light emitting semiconductor layer from being damaged when a growth substrate is separated through a laser lift off scheme using a laser beam, so that the growth substrate can be separated without damage. In addition, the process assisting region 51 can prevent the performance of the light emitting device from being damaged due to etch products created in an isolation etching process to divide the light emitting semiconductor layer into a plurality of unit structures.

The process assisting region 51 may include a material having superior adhesive property with a material constituting the light emitting semiconductor layer and having low reactivity with dry etch particles used in the isolation etching process.

When the passivation layer 700 is formed, the process assisting region 51 assists the passivation layer 700 having superior quality to be formed.

The ohmic contact region 52 forms an ohmic contact interface having low interfacial contact resistance together with the second conductive semiconductor layer 40, and allows current to be smoothly applied from the outside to the light emitting semiconductor layer perpendicularly to the light emitting semiconductor layer.

The ohmic contact region 52 may include a transparentor having optically high transmittance or a reflector having a high reflective rate. For example, if the ohmic contact region 52 is the transparentor, the ohmic contact region 52 may include at least one selected from the group consisting of ITO, ZnO, IZO, and NiO—Au. If the ohmic contact region 52 is a reflector, the ohmic contact region 52 may include at least one selected from the group consisting of Ag, alloy containing Ag, solid solution containing Ag, Rh, alloy containing Rh, solid solution containing Rh, Al, alloy containing Al, and solid solution containing Rh.

The current blocking region 53 prevents current applied to the light emitting semiconductor layer from being concentrated on a portion of the light emitting semiconductor layer, so that the current can be widely spread. For example, the current blocking region 53 may include one of an electric insulating material, empty space filled with air, and a material forming a schottky contact interface with respect to the second conductive semiconductor layer 40.

Although not shown, the current blocking region 53 may be divided into a plurality of regions.

The light emitting semiconductor layer including the second conductive semiconductor layer 40, the active layer 30, and the first conductive semiconductor layer 20 may include a nitride-based semiconductor material, which is a group III compound semiconductor material. For example, the first conductive semiconductor layer 20 may include a gallium nitride layer including an N type dopant such as Si, and the second conductive semiconductor layer 40 may include a P type dopant such as Mg. The active layer 30 emits light through the combination of electrons and holes. For example, the active layer may include one of InGaN, AlGaN, GaN, and AlInGaN. The wavelength of light emitted from the active layer 30 varies according to the type of a material constituting the active layer 30.

Meanwhile, although not shown, an interface modification layer may be additionally interposed between the second conductive semiconductor layer 40 and the functional complex layer 50.

The interfacial modification layer may include a supperlattice structure, one of InGaN, GaN, AlInN, AlN, InN, and AlGaN doped with first conductive impurities, one of InGaN, GaN, AlInN, AlN, InN, and AlGaN doped with second conductive impurities, or one of group III nitride-based elements having a nitrogen-polar surface. In particular, the interfacial modification layer having the supperlattice structure may include a nitride or a carbon nitride including group II, III, or IV elements.

The light emitting semiconductor layer is formed on the ohmic contact region 52 divided into a plurality of regions by the process assisting region 51, and the passivation layer 700 is formed at portions of lateral and top surfaces of the light emitting semiconductor layer.

At least a portion of the passivation layer 700 is provided on the process assisting region 51. For example, the passivation layer 700 may include one of $SiO_2$, $Al_2O_3$, and $Si_3N_4$ which are electric insulating materials.

The passivation layer 700 allows the light emitting semiconductor layer to be supported more stably, and prevents electrical short from occurring at the light emitting semiconductor layer.

The first electrode layer 900 is formed on the first conductive semiconductor layer 20, and can commonly make contact with unit structures of the first conductive semiconductor layer 20. In addition, a portion of the first electrode layer 900 is provided in the passivation layer 700 and overlaps with the light emitting semiconductor layer perpendicularly to the light emitting semiconductor layer.

The first electrode layer 900 makes ohmic contact with the first conductive semiconductor layer 20.

The light extracting structure 800 is formed on the first conductive semiconductor layer 20 and allows light emitted from the active layer 30 to be effectively extracted to the outside. For example, the light extracting structure 800 may be formed by selectively etching the first conductive semiconductor layer 20, or may be formed in the pattern obtained by selectively etching a nitride layer which is formed on the first conductive semiconductor layer 20 and does not include impurities.

FIGS. 2 to 15 are sectional views showing the method of manufacturing the light emitting device according to the first embodiment.

Referring to FIGS. 2 and 3, the light emitting semiconductor layer including the first conductive semiconductor layer 20, the active layer 30, and the second conductive semiconductor layer 40 is formed on the substrate 10. In addition, the functional complex layer 50 is formed on the second conductive semiconductor layer 40.

For example, the substrate 10 may include one of $Al_2O_3$, SiC, silicon Si and gallium arsenide GaAs.

Although not shown, before the first conductive semiconductor 20 is grown on the growth substrate 10, a buffer layer including at least one of InGaN, AlN, SiC, SiCN, and GaN may be formed on the growth substrate 10.

In addition, the interface modification layer may be formed between the second conductive semiconductor layer 40 and the functional complex layer 50.

The functional complex layer 50 includes the process assisting region 51, the ohmic contact region 52, and the current blocking region 53. FIG. 3 shows a plan view of the functional complex layer 50.

The process assisting region 51 may be formed in the form of a lattice cell, and the ohmic contact region 52 is divided into a plurality of unit cell regions H by the process assisting region 51. FIG. 3 illustrates a case in which the ohmic contact region 52 is divided into four unit cell regions H by the process assisting region 51.

The area of the unit cell region H is designed to be smaller than an area of the laser beam used when the substrate 10 is separated, and the area of the functional complex layer 50 may be designed to be larger than an area of a laser beam used when the substrate 10 is separated.

The current blocking region 53 may be formed in each unit cell region H. FIG. 3 illustrates the current blocking region 53 extending radially from the center of the ohmic contact region 52.

Referring to FIG. 4, the reflective ohmic contact layer 60, the diffusion barrier layer 70, and the first wafer bonding layer 80 are formed on the functional complex layer 50. Therefore, a first structure 100 shown in FIG. 4 can be manufactured.

Referring to FIG. 5, a second structure 200 including the support substrate 210 provided at a top surface thereof with the second wafer bonding layer 230 and provided at a bottom surface thereof with the third wafer bonding layer 220. The third wafer bonding layer 220 may include the same material as that of the second wafer bonding layer 230.

Referring to FIG. 6, a third structure 300 having a sacrificial separation layer 320 and a fourth wafer bonding layer 330 is prepared on a temporary substrate 310.

The temporary substrate 310 may include a material making thermal expansion coefficient difference of 2 ppm/° C. or less from the growth substrate 10, or a material the same as that of the growth substrate 10. For example, the temporary substrate 310 may include one of $Al_2O_3$, SiC, Si, and GaAs.

The sacrificial separation layer 320 may include one of a group II-Vi compound including ZnO, a group III-V compound including GaN, ITO, PZT, and SU-8, which are subject to thermo-chemical decomposition reaction as a laser beam is irradiated thereto, or one of Al, Au, Ag, Cr, Ti, $SiO_2$, and $SiN_x$ which are rapidly dissolved in a wet solution.

The fourth wafer bonding layer 330 may include the same material as that of the second wafer bonding layer 230.

Referring to FIG. 7, the first structure 100 shown in FIG. 4, the second structure 200 shown in FIG. 5, and the third structure 300 shown in FIG. 6 are bonded to each other, thereby forming a complex structure.

The first wafer bonding layer 80 is bonded to the second wafer bonding layer 230, and the third wafer bonding layer 220 is bonded to the fourth wafer bonding layer 330.

The first structure 100, the second structure 200, and the third structure 300 are bonded to each other at a predetermined pressure and a predetermined temperature in the range of about 300° C. to 600° C.

The third structure 300 is positioned corresponding to the first structure 100 while interposing the second structure 200 between the third structure 300 and the first structure 100, and the first structure 100 has a thermal expansion coefficient similar to that of the third structure 300. Accordingly, the cracks and debonding do not occur due to the difference in the thermal expansion coefficient when the first and second structures 100 and 200 are coupled with each other.

Referring to FIG. 8, the growth substrate 10 is separated from the complex structure shown in FIG. 7.

The growth substrate 10 may be separated by using an LLO scheme based on an eximer laser beam, or by using a dry etch scheme or a wet etch scheme.

When the eximer laser beam having a predetermined wavelength is focused on the growth substrate 10 and irradiated to the growth substrate 10, thermal energy is concentrated on the boundary surface between the substrate 10 and the first conductive semiconductor layer 20, so that the interfacial surface of the first conductive semiconductor layer 20 is thermo-chemically decomposed into Ga and N. Accordingly, the growth substrate 10 is separated.

The used laser beam must have a size greater than a size L2 of the ohmic contact region 52 divided by the process assisting region 51.

Therefore, if the second laser beam is irradiated after the first laser beam has been irradiated, the second laser beam overlaps with the first laser beam on the process assisting region 51.

Referring to FIG. 9, regions L, M, and N of the light emitting semiconductor layer on the process assisting region 51 are damaged due to the overlap of the laser beams.

Referring to FIG. 10, the regions L, M, and N of the light emitting semiconductor layer on the process assisting region 51 are removed through a MESA etching process based on a wet etching process or a dry etching process. Accordingly, the process assisting region 51 is exposed, so that the light emitting semiconductor layer is divided into a plurality unit structures.

Referring to FIG. 11, the passivation layer 700 is formed on the top and lateral surfaces of the light emitting semiconductor layer. The passivation layer 700 may make contact with the process assisting region 51.

The passivation layer 700 may have a thickness in the range of about 200 nm to about 1000 nm.

Referring to FIG. 12, the passivation layer 700 formed on the light emitting semiconductor layer is partially removed, and the light extracting structure 800 is formed on the first conductive semiconductor layer 20.

The light extracting structure 800 may be formed in an irregular concave-convex pattern through a wet etching process, or may be formed in a regular concave-convex pattern through a lithography process.

Referring to FIG. 13, the first electrode layer 900 is formed on the first conductive semiconductor layer 20.

The first electrode layer 900 can be electrically connected to the unit structures of the first conductive semiconductor layer 20, simultaneously.

At least a portion of the first electrode layer 900 overlaps with the process assisting region 51 perpendicularly to the process assisting region 51. A portion of the first electrode layer 900 may be filled in the passivation layer 700.

Referring to FIG. 14, the temporary substrate 310 is exposed through isolation etching 1000, and a plurality of light emitting devices are formed on the temporary substrate 310.

Referring to FIG. 15, the temporary substrate 310 is removed through an LLO scheme, a dry etching scheme, a wet etching scheme, a CMP scheme, or a polishing scheme.

When the temporary substrate 310 is separated through the LLO scheme, the sacrificial separation layer 320 is thermo-chemically decomposed, so that the temporary substrate 310 is removed.

After removing the third wafer bonding layer 220 and the fourth wafer bonding layer 330, the die-bonding layer 240 is formed under the support substrate 210.

Accordingly, the light emitting device according to the first embodiment can be manufactured.

FIG. 16 is a sectional view showing a light emitting device according to a second embodiment.

Hereinafter, the light emitting device according to the second embodiment will be described while focusing on the difference from the light emitting device according to the first embodiment in order to avoid redundancy.

Referring to FIG. 16, the light emitting device according to the second embodiment includes the support substrate 210, the diffusion barrier layer 70 on the support substrate 210, the reflective ohmic contact layer 60 on the diffusion barrier layer 70, the functional complex layer 50 on the reflective ohmic contact layer 60, the light emitting semiconductor layer including the second conductive semiconductor layer 40, the active layer 30, and the first conductive semiconductor layer 20 on the functional complex layer 50, and the first electrode layer 900 on the light emitting semiconductor layer.

The die-bonding layer 240 may be formed under the support substrate 210.

The first and second wafer bonding layers 80 and 230 may be formed between the support substrate 210 and the reflective ohmic contact layer 60.

The passivation layer 700 may be formed on the lateral surface of the light emitting semiconductor layer, and the light extracting structure 800 may be formed on the light emitting semiconductor layer.

The functional complex layer 50 includes the process assisting region 51, the ohmic contact region 52, and the current blocking region 53.

The process assisting region 51 is formed in the vicinity of the reflective ohmic contact layer 60, the ohmic contact region 52 is surrounded by the process assisting region 51, and the current blocking region 53 is provided in the ohmic contact region 52.

Although not shown, the interface modification layer may be additionally formed between the second conductive semiconductor layer 40 and the functional complex layer 50.

The first electrode layer 900 is formed on the first conductive semiconductor layer 20. The first electrode layer 900 makes ohmic contact with the first conductive semiconductor layer 20.

The light extracting structure 800 is formed on the first conductive semiconductor layer 20, and allows the light emitted from the active layer 30 to be effectively extracted to the outside.

FIGS. 17 to 19 are sectional views showing the method of manufacturing the light emitting device according to the second embodiment.

In the method of manufacturing the light emitting device according to the second embodiment, most of process steps are similar to those of the method of manufacturing the light emitting device according to the first embodiment. In particular, the method of manufacturing the light emitting device according to the first embodiment described with reference to FIGS. 2 to 12 is identical to the method of manufacturing the light emitting device according to the second embodiment.

Accordingly, the method of manufacturing the light emitting device according to the second embodiment corresponding to the manufacturing method that has been described with reference to FIGS. 2 to 12 will be omitted in order to avoid redundancy.

Referring to FIG. 17, the first electrode layer 900 is formed on each unit structure of the first conductive semiconductor layer 20 shown in FIG. 12.

Referring to FIG. 18, after performing the isolation etching 1000 to expose the temporary substrate 310, a plurality of light emitting devices are formed on the temporary substrate 310.

Referring to FIG. 19, the temporary substrate 310 is removed through the LLO scheme, the dry etching scheme, the wet etching scheme, the CMP scheme, or the polishing scheme.

When the temporary substrate 310 is separated through the LLO scheme, the sacrificial separation layer 320 is thermo-chemically decomposed, so that the temporary substrate 310 is removed.

After removing the third and fourth wafer bonding layers 220 and 330, the die-bonding layer 240 is formed under the support substrate 210.

Accordingly, the light emitting device according to the second embodiment can be manufactured.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiment is applicable to the method of manufacturing the semiconductor device used as an electronic device or a light source.

What is claimed is:

1. A light emitting device comprising:
   a support substrate;
   a reflective layer on the support substrate;
   a first layer including ohmic contact regions and a plurality of insulating regions on the reflective layer;
   a light emitting semiconductor layer disposed on the first layer and including a second conductive semiconductor layer, an active layer on the second conductive semiconductor layer, and a first conductive semiconductor layer on the active layer;
   an electrode on a top surface of the first conductive semiconductor layer;
   a light extracting structure on the top surface of the first conductive semiconductor layer,
   a roughness disposed over the plurality of the insulating regions; and
   a passivation layer disposed on top and side surfaces of the light emitting semiconductor layer, the passivation layer being in contact with the first layer,
   wherein the light extracting structure is disposed adjacent to the electrode, and
   wherein the insulating regions extend radially from a center of the ohmic contact regions.

2. The light emitting device of claim 1, further comprising a diffusion barrier layer between the support substrate and the reflective layer.

3. The light emitting device of claim 2, further comprising a wafer bonding layer between the diffusion barrier layer and the support substrate.

4. The light emitting device of claim 1, wherein the wafer bonding layer including a first wafer bonding layers and a second wafer bonding layers.

5. The light emitting device of claim 1, wherein the light extracting structure contacts the top surface of the first conductive semiconductor layer.

6. The light emitting device of claim 1, wherein a lowermost surface of the electrode is lower than a top surface of the active layer.

7. The light emitting device of claim 1, wherein a top surface of the electrode is higher than a top surface of the light extracting structure.

8. The light emitting device of claim 1, further comprising a die-bonding layer is disposed under the support substrate.

9. The light emitting device of claim 1, wherein the light extracting structure is formed in a prescribed pattern obtained by selectively etching a nitride layer which is formed on the first conductive semiconductor layer and does not include impurities.

10. The light emitting device of claim 1, wherein the ohmic contact regions include at least one selected from the group consisting of ITO, ZnO, IZO, and NiO—Au.

11. A light emitting device comprising:
    a reflective layer;
    a first layer including ohmic contact regions and a plurality of insulation regions on the reflective layer;
    a light emitting semiconductor layer on the reflective layer and including a plurality of light emitting structures disposed separate from each other;

an electrode on the light emitting semiconductor layer to overlap a portion of each of the plurality of light emitting structures;
a light extracting structure on the light emitting semiconductor layer, and
a roughness disposed over a plurality of insulating regions,
wherein a width of a top surface of the electrode is smaller than a width of a flat surface of the light emitting semiconductor layer between the light extracting structures, and
wherein the insulating regions extend radially from a center of the ohmic contact regions.

12. The light emitting device of claim 1, wherein the light emitting semiconductor layer includes a first light emitting structure and a second light emitting structure separate from the first light emitting structure, and wherein the first electrode is disposed to overlap a portion of both the first and second light emitting structures.

13. The light emitting device of claim 11, wherein the light extracting structure is disposed on a top surface of the light emitting semiconductor layer, adjacent to the electrode on opposite sides of the electrode.

* * * * *